(12) United States Patent
Dauksher et al.

(10) Patent No.: US 6,355,384 B1
(45) Date of Patent: Mar. 12, 2002

(54) MASK, ITS METHOD OF FORMATION, AND A SEMICONDUCTOR DEVICE MADE THEREBY

(75) Inventors: William J. Dauksher, Mesa; Pawitter S. Mangat, Gilbert, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/519,739

(22) Filed: Mar. 6, 2000

(51) Int. Cl.$^7$ .............................. G03F 9/00; G21K 5/00
(52) U.S. Cl. .............................................. 430/5; 378/35
(58) Field of Search ....................... 430/5, 322; 378/34, 378/35

(56) References Cited

U.S. PATENT DOCUMENTS 5,876,881 A * 3/1999 Kawata .......................... 430/5
6,051,346 A * 4/2000 Kornblit et al. ................ 430/5

OTHER PUBLICATIONS

Don L. Kendall et al., "Orientations of the Third Kind: The Coming Of Age Of (110) Silicon", Elsevier Science Publishers B.V., Amsterdam, 1985, pp. 107–124.

Don L. Kendall, "Vertical Etching Of Silicon At Very High Aspect Ratios", 1979 by Annual Reviews Inc., Verticle Etching, pp. 373–403.

Kenneth E. Bean, "Anisotropic Etching of Silicon", 1978 IEEE Transactions On Electron Devices, vol. ED–25, No. 10, pp. 1185–1192.

Ernest Bassous, "Fabrication of Novel Three–Dimensional Microstructures by the Anisotropic Etching of (100) and (110) Silicon", Oct. 1978 IEEE Transactions of Electron Devices, vol. ED–25,No. 10, pp. 1178–1185.

* cited by examiner

*Primary Examiner*—S. Rosasco
(74) *Attorney, Agent, or Firm*—Robert A. Rodriguez; Joseph Lally

(57) ABSTRACT

A method for fabricating a patterning mask is disclosed in which a membrane layer is deposited on a first surface of a substrate. Patterned and unpatterned portions of the substrate are then defined on a second surface of the substrate. A majority of the thickness of substrate in the unpatterned portions is then dry etched to partially define a strut having sidewalls that are substantially perpendicular to the first surface. Wet etching is then performed to etch through the remaining thickness of the substrate to expose the bottom surface of the membrane layer and completely define the strut. Scattering elements may then be formed over the membrane layer. In one embodiment, the substrate is silicon and has a (110) orientation and an edge of the silicon struts is aligned to a {111} plane. In another embodiment, an edge of the silicon struts is aligned to a {221} plane.

18 Claims, 5 Drawing Sheets

MASK, ITS METHOD OF FORMATION, AND A SEMICONDUCTOR DEVICE MADE THEREBY

FIELD OF THE INVENTION

The present invention relates generally to the field of semiconductor manufacturing and more particularly to a process of forming and using a lithographic mask.

RELATED ART

In the field of semiconductor manufacturing, the ever smaller dimensions required to make state-of-the-art semiconductor devices are rapidly approaching the limits of optical lithographic techniques. Alternatives are being investigated to replace optical lithography once the resolution and depth of focus limits of optical lithography tools are reached. One lithographic technique that is being investigated is projection electron beam (E-beam) lithography. One implementation of electron beam lithography is referred to as scattering with angular limitation in projection electron beam lithography, also referred to as SCALPEL.

SCALPEL masks are basically comprised of a thin, low atomic number membrane material which is fairly transmissive to electrons. On top of these membranes, patterned high atomic number scattering material is formed. In order to fabricate the mask, portions of the silicon substrate are removed to form free-standing membranes. The membranes have width and length dimensions that are approximately 1.1 mm×12.1 mm. Using conventional wet etch processes to form the membranes on a 200 mm silicon substrate having a (100) crystal orientation, only approximately 528 membranes (an array of 8×66 membranes) can be formed. This presently corresponds approximately to a semiconductor die having dimensions of approximately 24×16.5 mm. As semiconductor devices become more complex, chip die dimensions of 25×25 mm will likely be required and an array of 10×100 (1000 membranes) will be needed.

Turning to the drawings, FIG. 1 is a cross sectional view of a mask 10 used for a SCALPEL process. The mask 10 includes a membrane layer 104 formed overlying a substrate 102. Typically, the membrane layer 104 is silicon nitride and the substrate 102 is monocrystalline silicon. On one surface of mask 10, scattering elements 108 are formed overlying membrane layer 104. On the opposite surface of mask 10, portions of substrate 102 are removed to form voids 110 and struts 103. The voids 110 define the regions 109 of membrane layer 104 over which scattering elements 108 may be formed. The scattering elements define the lithographic patterns used for forming the semiconductor devices.

One problem in manufacturing SCALPEL masks is that the formation of struts 103 is typically achieved using a wet etch process that results in a sloped strut sidewall indicated by reference numeral 111. The sloped sidewall 111 is characteristic of isotropic wet etch processes when etching semiconductor substrates with a (100) crystal orientation. Unfortunately, sloped sidewalls 111 limit the area of membrane layer 104 that can be used to form overlying functional scattering elements. This limitation translates into a corresponding limitation on the maximum die size that can be produced using mask 10.

To avoid the problems associated with sloped sidewall 111, one alternative in the formation of SCALPEL masks is to utilize a dry etch process to form the voids 110 in substrate 102. Unfortunately, however, dry etch processes typically require an etch stop layer formed between substrate 102 and membrane layer 104. The etch stop layer is typically required because of the lack of sufficient selectivity between substrate 102 and membrane layer 104 associated with dry etch processes. The introduction of additional processing required to fabricate the etch stop layer adds to the cost and complexity of the process required to form the mask. Further, the additional handling can result in an increased number of defects that can limit the yield of the mask formation process. In addition, if it is not subsequently removed, the presence of an etch stop layer during the fabrication of semiconductor devices can limit the throughput due to the loss of transmission of electrons through the additional layers on the mask. Furthermore, the deposition of the etch stop layer must be optimized to ensure that the stress associated with the etch stop layer matches the stress of the membrane layer thereby adding additional complexity to the process. Accordingly, it is highly desirable to implement a mask fabrication process that eliminates the sloped sidewall associated with conventional wet processing while minimizing the additional cost and complexity of the process.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 2:
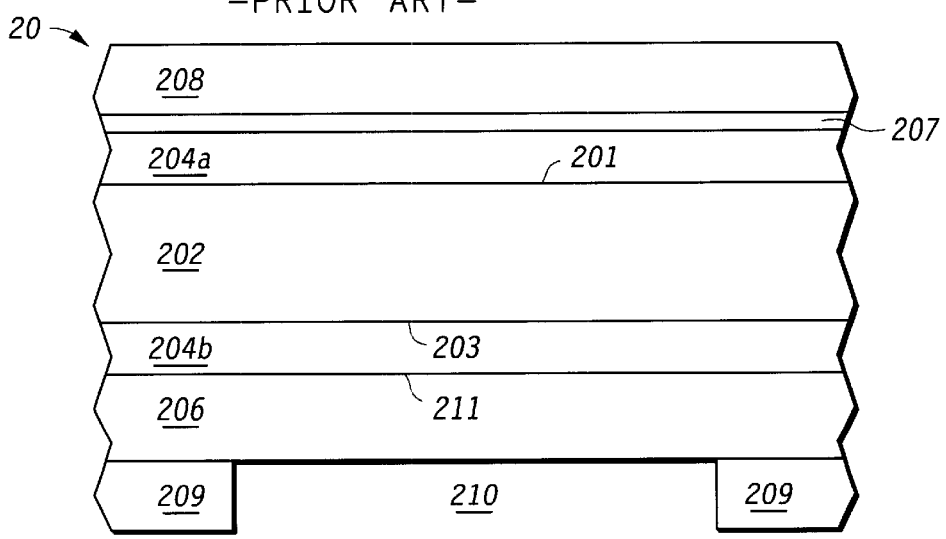
FIG. 2 is a partial cross sectional view of a SCALPEL mask at an intermediate step according to one embodiment of the present invention.

Turning now to the drawings, FIGS. 2–6 illustrate various partial cross-sectional views in the formation of a patterning mask 20 according to one embodiment of the present invention. In one embodiment, patterning mask 20 is suitable for use as a projection E-beam lithography mask. In FIG. 2, mask 20 includes a substrate 202 typically comprised of single crystal silicon or other suitable semiconductor material. Substrate 202 includes a first surface 201 and a second surface 203. The thickness of silicon layer 202 is typically in the range of approximately 725 microns as is standard for 200 millimeter wafers. A first membrane layer 204a has been deposited or otherwise formed on first surface 201 of substrate 202. In one embodiment, a second membrane layer 204b is formed on a second surface 203 of substrate 202 during the formation of first membrane layer 204a. In one embodiment, membrane layers 204a and 204b include a silicon nitride material. In one embodiment, membrane layer 204a and 204b include silicon-rich, silicon nitride. For purposes of this disclosure, a silicon-rich, silicon nitride refers to a silicon-nitrogen compound with relatively more silicon than stoichiometric $Si_3N_4$. The silicon-rich, silicon nitride used in one embodiment of membrane layer 204a is suitable for enabling control of the tensile stress of membrane layer 204a. In one embodiment, the tensile stress of membrane layer 204a is in the range of approximately 100–200 mega-Pascals (MPa). Although the depicted embodiment illustrates membrane layers 204a and 204b on either side of substrate 202, another embodiment contemplates a single membrane layer 204a formed on a first surface 201 of substrate 202. The fabrication of membrane layers 204a and 204b may be suitably achieved using a low pressure chemical vapor deposition (LPCVD) process or a plasma enhanced CVD (PECVD) process or the like.

Following the formation of membrane layers 204a and 204b, the embodiment of mask 20 depicted in FIG. 2 illustrates an etch stop layer 207 fabricated over membrane layer 204a and an electron scattering layer 208 formed over etch stop layer 207. In one embodiment, etch stop layer 207 comprises a chromium layer of approximately 5 nanometers in thickness. Electron scattering layer 208 is suitably comprised of a material with a relatively high atomic number (Z). Preferably, the atomic number of electron scattering layer 208 is in excess of approximately 70. In contrast, the atomic number of membrane layer 204a is preferably less than approximately 20. The relatively high atomic number of electron scattering layer 208 is designed to promote a relatively high number of collisions between electrons directed at mask 20 while the relatively low atomic number of membrane 204a is designed to limit the number of electron collisions occurring in membrane layer 204a.

Following the formation of etch stop layer 207 and electron scattering layer 208, the surface opposite the scattering elements is patterned to define patterned portions (referred to herein as voids) and unpatterned portions (referred to herein as struts) of substrate 202. The depicted embodiment of mask 20 includes the formation of an oxide layer 206 and a resist mask 209 on the surface 211 of membrane layer 204b opposite the surface of layer 204b that contacts second surface 203 of substrate 202. Oxide layer 206 may be formed on layer 204b with a conventional TEOS or PECVD deposition or the like. In the preferred embodiment, oxide layer 206 is approximately 3 microns thick. Following the formation of oxide layer 206, a resist mask 209 is patterned on oxide layer 206 in a conventional manner. Resist layer 209 defines an opening 210 that will be used to form voids in substrate layer 202.

Figure 3:
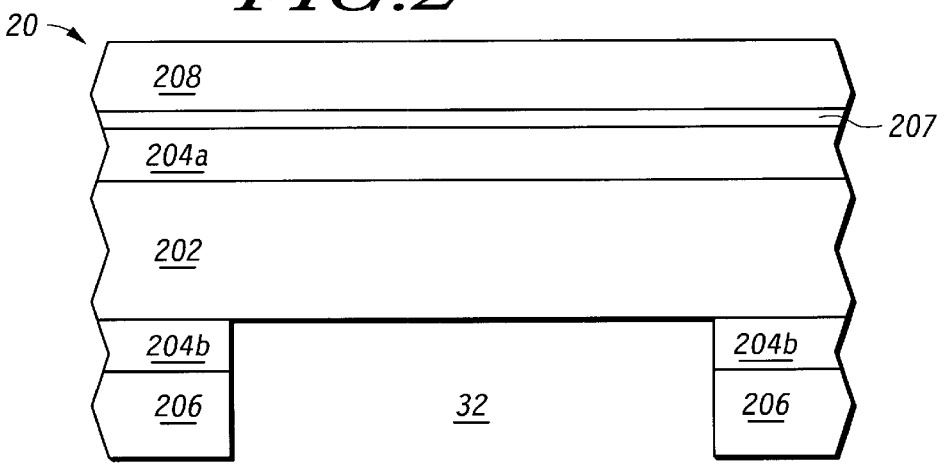
FIG. 3 is a processing step subsequent to FIG. 2 in which a pattern is formed in oxide and nitride layers of the mask of FIG. 2.

Turning now to FIG. 3, an opening 32 has been formed in oxide layer 206 and layer 204b. The formation of opening 32 is accomplished with a conventional anisotropic etch process as will be familiar to those knowledgeable in the field of semiconductor processing. As depicted in FIG. 3, resist layer 209 has been removed from mask 20. Although the embodiment depicted in FIGS. 2 and 3 indicate an oxide layer 206, another embodiment contemplates the elimination of oxide layer 206 and the formation of openings 32 using only resist layer 209. In this embodiment, a thickness of resist layer 209 is preferably approximately 6 microns in thickness. Alternatively to forming opening 32 in oxide layer 206 and membrane layer 204b with a anisotropic dry etch process, a wet etch process may be used to form opening 32 in oxide layer 206 and membrane layer 204b as will be familiar to those skilled in the field of semiconductor fabrication.

Figure 1:
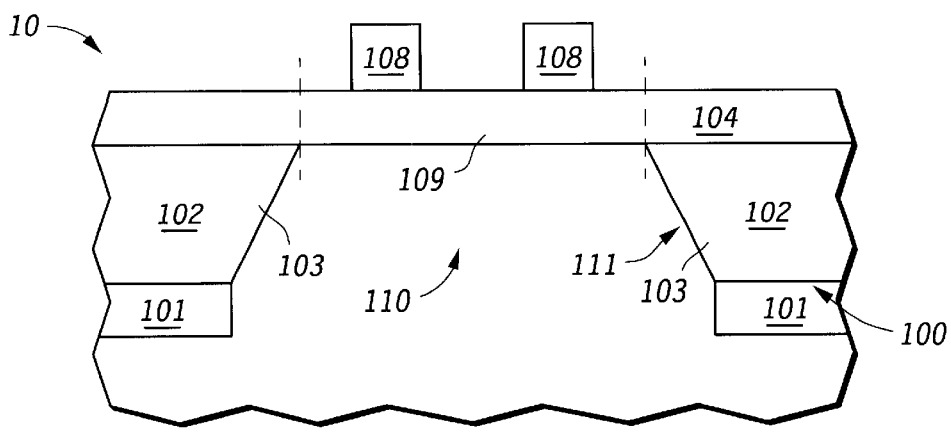
FIG. 1 is a cross sectional view of a SCALPEL mask (prior art)
Figure 4:
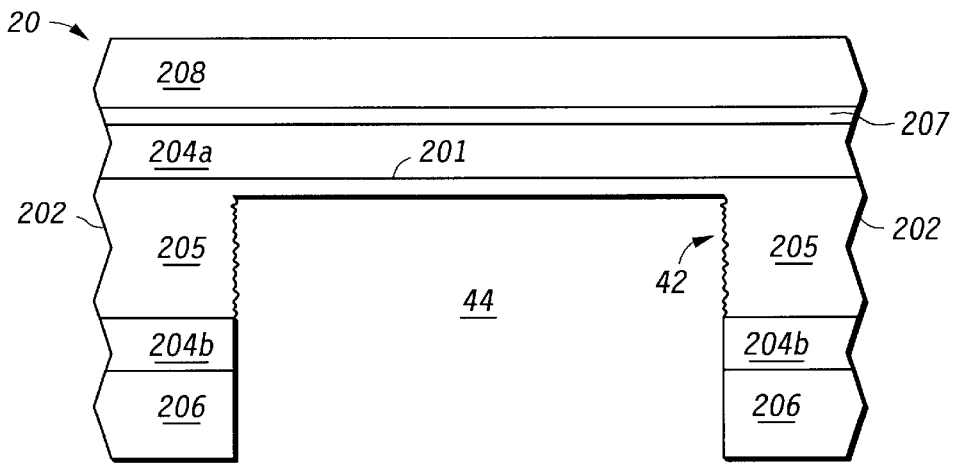
FIG. 4 is a partial cross sectional view of a processing step subsequent to FIG. 3 in which the silicon substrate is partially anisotropically etched using a dry etch process.

Turning now to FIG. 4, a dry etch process is employed to etch patterned portions of substrate 202 through a majority of the thickness of substrate 202 to create an opening 44 in substrate 202 that defines sidewalls 42 of corresponding struts 205. Opening 44 is preferably fabricated using an anisotropic silicon etch process that results in sidewalls 42 that are substantially perpendicular to the first surface 201 of substrate 202. Silicon etch processes suitable for forming opening 44 are described in U.S. Pat. Nos. 5,626,716; 5,598,312; and 5,501,893 which are incorporated by reference herein. The anisotropic dry etch process results in substantially vertical sidewalls 42 on opening 44. The substantially vertical sidewalls 42 are in contrast to the sloped sidewalls 111 resulting from the wet etch process used in conjunction with conventional mask fabrication techniques described previously with respect to FIG. 1. The substantially vertical sidewalls 42 permit openings 44 to be fabricated in close proximity to one another thereby maximizing the percentage of the mask that can be used to define the semiconductor device. In other words, the substantially vertical sidewalls 42 enabled by the anisotropic dry etch process permit the fabrication of devices with a larger die size. In the preferred embodiment, the formation of opening 44 in substrate 202 is terminated prior to etching completely through substrate layer 202. Preferably, approximately 95% of substrate 202 is etched through in the worst case location on the wafer. In other words, a plurality of openings 44 are fabricated across the mask 20, although only a single opening 44 is depicted in the figures. Due to etch rate non-uniformity, an opening 44 in one region of the mask 20 may be deeper than an opening 44 in another region of mask 20. In the preferred embodiment, the dry etch process used to form opening 44 is controlled such that the deepest opening consumes 95% of the thickness of substrate layer 202. The invention contemplates terminating the anisotropic dry etch process used to form opening 44 prior to etching completely through substrate layer 202 because the dry etch process lacks selectivity between membrane layer 204a and substrate layer 202. While the uniformity of the dry etch process dictates when to terminate the process, the use of a dry etch process beneficially enables the formation of substantially vertical sidewalls that are desirable to increase the area available for defining the semiconductor device.

Figure 5:
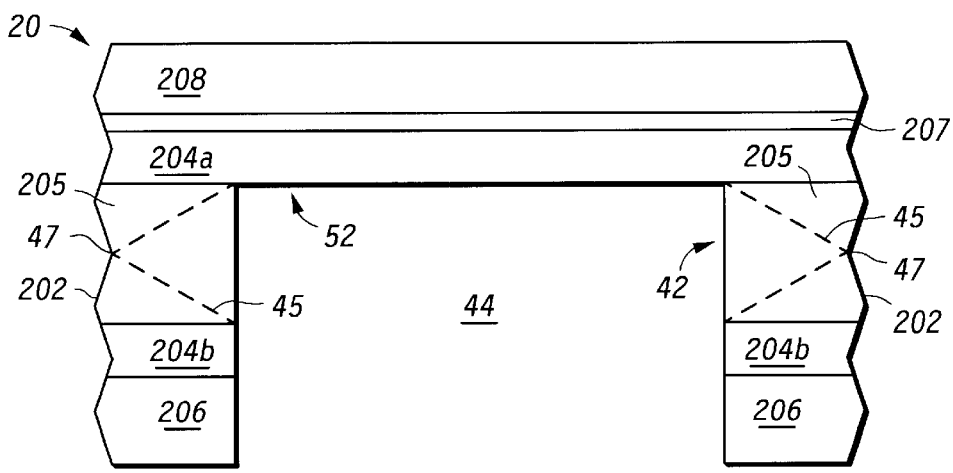
FIG. 5 is a processing step subsequent to FIG. 4 in which remaining portions of the substrate are etched with a wet etch process.

Turning now to FIG. 5, opening 44 is completed by wet etching through the remaining thickness of substrate layer 202 such that opening 44 exposes a bottom surface 52 of membrane layer 204a and completely defines the struts 205. In the preferred embodiment, the wet etch process comprises subjecting mask 20 to a potassium hydroxide (KOH) solution maintained at a temperature in the range of approximately 65–100° C. Because the KOH wet etch process has a very high selectivity (in excess of 1000 to 1) with respect to membrane layer 204a, the wet etch process is suitable for clearing the remaining portions of substrate layer 202 from opening 44.

In the preferred embodiment, the substrate layer 202 used in conjunction with the present invention has a crystal orientation of (110). (110) orientation wafers enable the combination of wet and dry processes as described herein. Typically, the most widely available semiconductor wafers have a (100) crystal orientation. The present invention contemplates the use of wafers having a (110) crystal orientation to enable the combination of a dry and wet process to produce substantially vertical sidewalls 42 in openings 44. If (100) oriented wafers are subjected to the combination dry and wet etch process described herein, the wet etch process would result in the formation of "hour glass" struts as indicated by reference numeral 45. The hour glass struts will be formed in a (100) oriented wafer during the wet etch portion of the process due to the preference for the KOH solution to find the {111} planes of the wafer. In other words, the outline of the hour glass struts 45 comprise the {111} planes of the (100) oriented wafer. This preferential or directional etch is also responsible for the sloped sidewall 111 depicted in FIG. 1. In the worst case scenario using a prior art (100) oriented wafer, depending upon the amount of time of the wet etch portion of the process, the strut may be completely severed at the narrowest portion (indicated by reference numeral 47) of the hour glass strut 45 thereby resulting in the disintegration of the entire mask structure. In contrast, in accordance with an embodiment of the present invention, the sidewall 42 is oriented along the {111} planes in a (110) oriented wafer. Thus, during the wet etch portion of the process, no significant undercutting of the strut is encountered. In addition, the wet etch process performed on (110) oriented wafers farther defines the substantially vertical sidewall 42 by polishing the sidewalls and removing any stringers resulting from the dry etch portion of the process.

Figure 6:
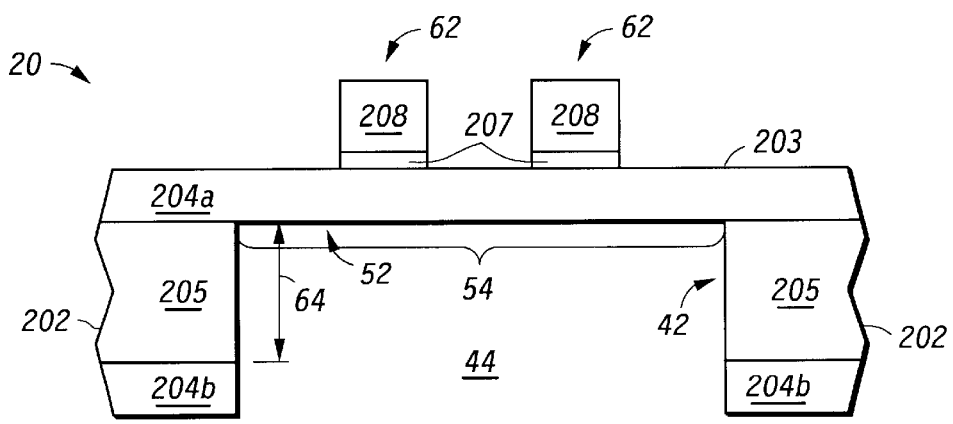
FIG. 6 is a processing step subsequent to FIG. 5 in which scattering elements are formed on the membrane layer.

Turning now to FIG. 6, completion of mask 20 is accomplished by formation of scattering elements 62 overlying membrane layer 204a, which overlies and contacts the silicon struts 205. Sidewalls 42 of each silicon strut 205 extend from membrane layer 204a substantially perpendicular to the surface of membrane layer 204a over most of sidewall. In contrast to the prior art struts 103 shown in FIG. 1, the struts in FIG. 6 now include sidewalls that have a height dimension 64 extending from the membrane 204a wherein the sidewalls are substantially perpendicular to the surface 52 along at least most of the height.

In one embodiment, each scattering element 62 includes an electron scattering portion 208 comprised of a material with a relatively high atomic number such as, for example, tantalum silicon nitride (TaSiN). In addition, each scattering element 62 may include an etch stop portion 207 preferably comprised of a chromium layer of approximately 5 nanometers in thickness. Scattering elements 62 are formed over the region 54 of membrane layer 204a defined by opening 44.

Figure 7:
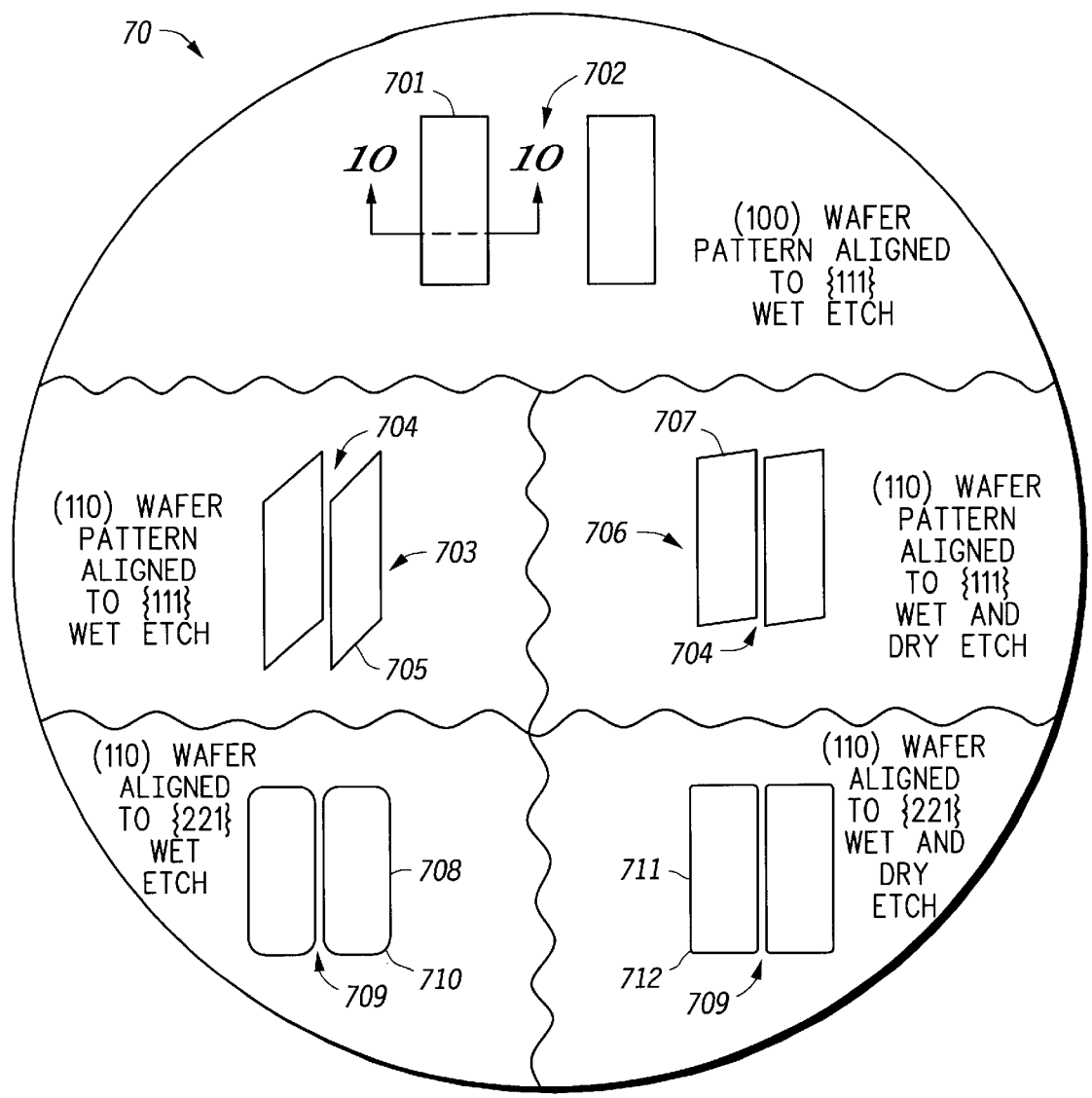
FIG. 7 illustrates top views of membranes formed according to various processes using various substrates and substrate orientations.

FIG. 7 illustrates membrane shapes resulting from various fabrication processes and starting material orientation. Reference numeral 701 indicates a membrane formed using a wet etch only process on a wafer having a (100) crystal orientation. Although this process results in a substantially rectangular membrane 701, the isotropic nature of the wet etch processing of the (100) wafers results in a spacing requirement 702 between adjacent membranes that is approximately equal to the width of each membrane 701. As an example, the spacing requirement 702 between adjacent membranes 701 for a 725 micron thick 200 millimeter having a (100) crystal orientation is in the range of approximately 1.1 millimeters.

Reference numeral 703 indicates membranes fabricated using a wet only process on wafers having a (110) crystal orientation and in which at least one edge of the membrane pattern is aligned to the {111} plane. In other words, at least one edge of silicon struts 205 in FIG. 6 is aligned to the {111} plane. The space 704 between adjacent membrane 703 using this process is up to approximately an order of magnitude less than the space 702 between adjacent membranes 701 in a wet etch process of (100) oriented wafers. Unfortunately, however, the wet etch of wafers having a (110) crystal orientation aligned to the {111} plane results in angular sidewalls as indicated by reference numerals 705, which prevents membrane 703 from obtaining a substantially rectangular shape. This angular sidewall 705 also undesirably increases the minimum width between adjacent rows of membranes 703.

In accordance with embodiments of the present invention, using wafers having a (110) crystal orientation produces a variety of strut and membrane alignment options. A second option available includes aligning at least one edge of the membrane pattern (i.e., one edge of struts 205 in FIG. 6) to the {221} plane of the (110) oriented wafer. This alignment results in the formation of membranes 708 as indicated in FIG. 7. Membranes 708 produced by a wet only process using wafers having a (110) crystal orientation in which the pattern is aligned to the {221} plane have a rectangular shape with substantially rounded corners indicated by reference numeral 710. Similar to the membranes 703 described previously, the space 709 between adjacent membranes 708 is considerably less than the space 702 of the membranes 701. Thus, membranes 703 and 708 illustrate that the use of (110) oriented wafer beneficially reduces the minimum spacing between adjacent membranes thereby increasing the maximum permitted die size that can be fabricated even if the etch process consists solely of a wet etch portion. To achieve even greater benefit, the combination of wet and dry etch described previously in detail with respect to FIGS. 2–5 result in the formations of membranes 706 and 711 as depicted in FIG. 7. Membranes 706 depict the result of a dry and wet etch combination process performed on wafers having a (110) crystal orientation in which the membrane pattern is aligned to the {111} plane. While the minimum spacing 704 remains the same as the spacing between adjacent membrane 703 associated with the wet only process, the combination of wet and dry process results in a substantially more rectangular membrane 706. Thus, the combination of dry and wet processing on wafers having a (110) crystal orientation results in a membrane with the substantially rectangular shape achieved with wet etch processing on wafers having a (100) crystal orientation while reducing the minimum pitch between adjacent membranes by an order of magnitude. Similarly, the membranes 711 associated with a combination wet/dry etch process performed on wafers having a (110) crystal orientation aligned to a {221} plane also produce substantially rectangular membranes with a minimum membrane to membrane pitch. Moreover, because the wet/dry process is used instead of a dry etch process, the need for an etch stop and its associated additional processing is eliminated.

The space requirement 702 between adjacent membranes 701 in a wet etch only process is a direct result of the preferential etching characteristics associated with a KOH etch and wafers having a (100) crystal orientation and, cannot therefore, be substantially reduced. Moreover, the combination of wet and dry processing is not a viable option for (100) oriented wafers because of the tendency to produce hour glass shaped and possibly severed struts as described previously with respect to FIG. 5. In addition, dry etch processing only, while theoretically achievable, increases the cost, complexity, and defectivity of the mask fabrication process and can reduce the performance of the resulting mask.

Figure 8:
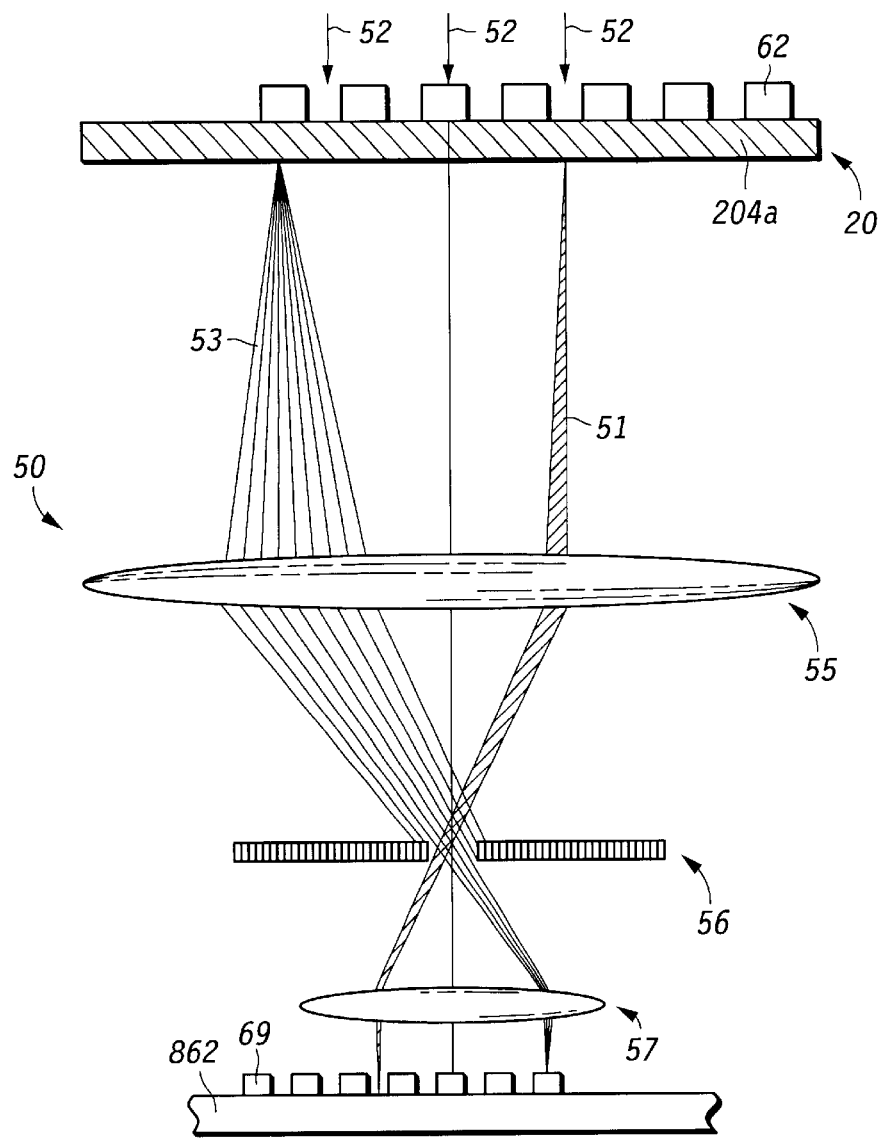
FIG. 8 illustrates the use of a mask fabricated according to the present invention to pattern a semiconductor wafer.

In accordance with embodiments of the present invention, mask 20 as described previously can be used in a projection E-beam lithography tool 50 as illustrated in FIG. 8 to process a substrate 862 that is placed in lithography tool 50 with patterning mask 20. Electron beams (radiation), as illustrated by arrows 52, are directed toward mask 20. Mask 20 includes the membrane layer 204a, and scattering elements 62. Radiation 52 passes relatively unobstructed through portions of mask 20 comprising membranes 204a as illustrated by the unscattered electron beam 51. In areas of mask 20 where scattering elements 62 are present, radiation 52 is scattered as illustrated by scattered electron beam 53. Electron beams 51 and 53 are then focused by lens 55 and passed through aperture 56 before reaching a second lens 57 from which the electron beams are directed to a semiconductor device substrate 862. The unscattered electron beam 51 passes through aperture 56 relatively unobstructed to expose the resist layer 69 coated over semiconductor substrate 862. Only a relatively small portion of scattered electron beam 53 passes through aperture 56. This small portion is incapable of substantially exposing resist layer 69. This results in the formation of high contrast images on semiconductor device substrate 862.

Figure 9:
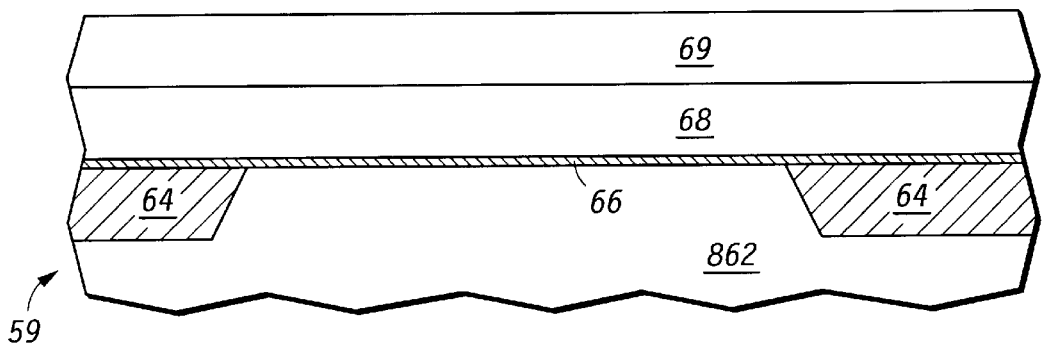
FIG. 9 is a partial cross sectional view of a partially completed integrated circuit formed on a semiconductor wafer.
Figure 10:
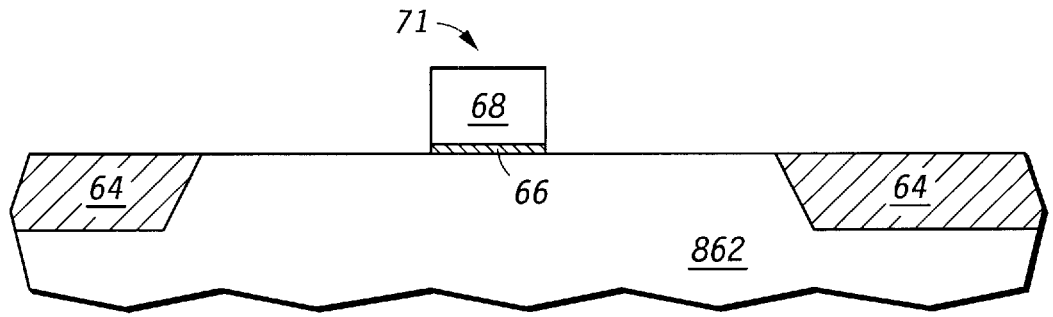
FIG. 10 is a processing step subsequent to FIG. 9 in which a conductive gate element is formed over the semiconductor substrate.
Figure 11:
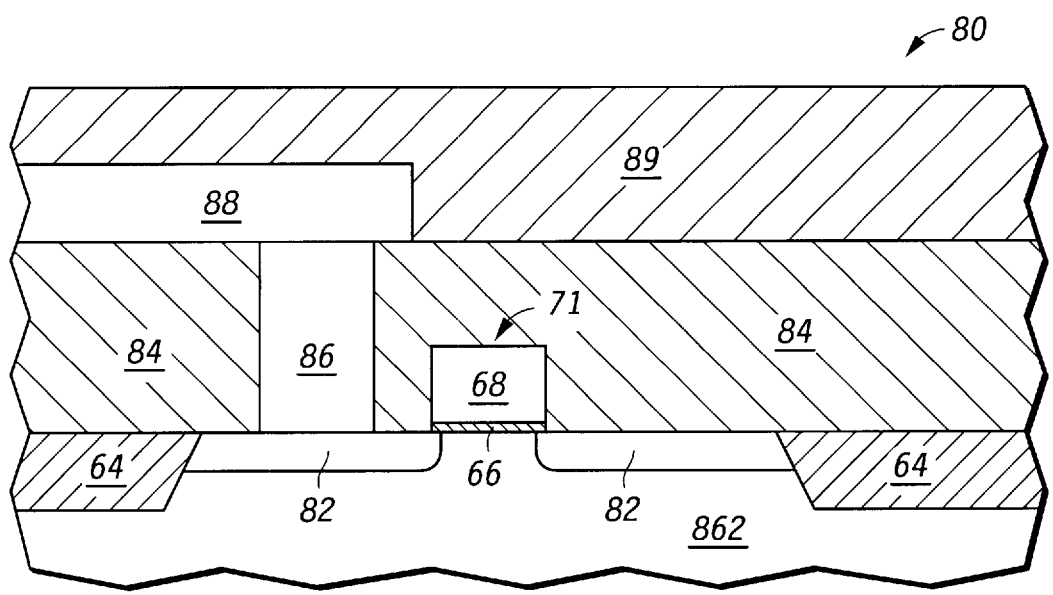
FIG. 11 is a processing step subsequent to FIG. 10 in which a transistor is formed in the substrate and back end metalization has been completed.

FIGS. 9–11 further illustrate the processing of a semiconductor substrate using a SCALPEL mask 20 to form an integrated circuit. FIG. 9 illustrates a partially completed semiconductor device 59 including a substrate 862 with field isolation regions 64. A gate dielectric layer 66, a conductive layer 68, and a photoresist layer 69 are formed overlying substrate 862. FIG. 10 shows the partially completed semiconductor device after forming gate electrode 71 from conductive layer 68 using the system illustrated in FIG. 8. The processing of substrate 862 continues until a substantially completed semiconductor device 80 is formed as shown in FIG. 11. Semiconductor device 80 now includes doped regions 82, an interlevel dielectric layer 84, a conductive plug 86, an interconnect 88, and a passivation layer 89. Using embodiments of the present invention, limitations of the prior art are overcome. For example, the overall manufacturability of devices with small features is improved because of the increase in feature density resulting from the substantially vertical sidewalls associated with mask 20 enables the fabrication of larger die. In addition, the combination of wet and dry processing enables the formation of substantially vertical sidewalls without requiring the implementation of an etch stop layer to terminate a dry etch process.

The mask 20 described above may alternatively be used in x-ray lithographic processes. In this case, the scattering elements are replaced by absorbing elements. In both cases, the scattering elements and the absorbing elements overlie a membrane layer less than approximately 10 microns thick and form a medium used to define patterned resist features on the semiconductor device substrate. In yet another embodiment, substrates having a (110) crystal orientation can be processed using the wet/dry etching technique described herein to fabricate micro-electro mechanical system (MEMS) devices. Such devices are suitable for use in pressure sensors, accelerometers etc.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A patterning mask comprising: A silicon nitride membrane having a surface overlying and contacting silicon struts defined in
    a silicon substrate, wherein:
        the silicon substrate is further characterized as having a (110) crystal orientation; and
        the silicon struts include sidewalls having a height dimension extending from the membrane wherein the sidewalls are substantially perpendicular to the surface along at least most of the height.

2. The patterning mask of claim 1, wherein the patterning mask is further characterized as a projection electron beam lithography mask.

3. The patterning mask of claim 1, wherein at least one edge of the silicon struts is aligned to a {111} plane.

4. The patterning mask of claim 3, wherein an opening in the silicon substrate having sidewalls defined by the struts has a shape that is further characterized as trapezoidal.

5. The patterning mask of claim 1, wherein at least one edge of the silicon struts is aligned to a {221} plane.

6. A method for fabricating a patterning mask comprising:
    depositing a membrane layer on a first surface of a silicon substrate, the membrane layer having a top surface opposite the first surface and a bottom surface toward the first surface;
    patterning a second surface of the silicon substrate that is opposite the first surface to define patterned and unpatterned portions of the silicon substrate;
    dry etching unpatterned portions of the silicon substrate through a majority of a thickness of the silicon substrate to partially define a strut having sidewalls, the sidewalls being substantially perpendicular to the first surface; and
    wet etching through a remaining thickness of the silicon substrate to expose the bottom surface of the membrane layer and completely define the strut.

7. The method of claim 6, further comprising forming scattering elements over the membrane layer.

8. The method of claim 6, wherein the patterning mask is further characterized as a projection electron beam lithography mask.

9. The method of claim 6, wherein the membrane includes silicon nitride.

10. The method of claim 6, wherein the silicon substrate is further characterized as having a (110) crystal orientation and at least one edge of the silicon struts is aligned to a {111} plane.

11. The method of claim 6, the silicon substrate is further characterized as having a (110) crystal orientation and at least one edge of the silicon struts is aligned to a {221} plane.

12. The method of claim 6, wherein wet etching includes etching the silicon substrate in a solution of potassium hydroxide at a temperature in a range of approximately 65–100 degrees Celsius.

13. A method for processing a substrate comprising the steps of:

placing a semiconductor substrate into a lithography tool having a patterning mask, wherein the patterning mask includes:

A silicon nitride membrane having a surface overlying and contacting silicon struts defined in a silicon substrate wherein:

the silicon substrate is further characterized as having a (110) crystal orientation; and the silicon struts include sidewalls having a height dimension extending from the membrane wherein the sidewalls are substantially perpendicular to the surface along at least most of the height dimension; and patterning a feature on the semiconductor substrate.

14. The method of claim 13, wherein the patterning mask is further characterized as a projection electron beam lithography mask.

15. The method of claim 13, wherein the silicon substrate is further characterized as having a (110) crystal orientation and at least one edge of the silicon struts is aligned to a {111} plane.

16. The method of claim 13, wherein the silicon substrate is further characterized as having a (110) crystal orientation and at least one edge of the silicon struts is aligned to a {221} plane.

17. The method of claim 13, wherein the patterning mask is formed by:

depositing a membrane layer on a first surface of a silicon substrate, the membrane layer having a top surface opposite the first surface and a bottom surface toward the first surface;

patterning a second surface of the silicon substrate that is opposite the first surface to define patterned and unpatterned portions of the silicon substrate;

dry etching unpatterned portions of the silicon substrate through a majority of a thickness of the silicon substrate to partially define a strut having sidewalls, the sidewalls being substantially perpendicular to the first surface; and wet etching through a remaining thickness of the silicon substrate to expose the bottom surface of the membrane layer and completely define the strut.

18. The method of claim 17, wherein the wet etching includes etching the silicon substrate in a solution of potassium hydroxide at a temperature in a range of approximately 65–100 degrees Celsius.

* * * * *